United States Patent [19]

Lee

[11] Patent Number: 5,124,777
[45] Date of Patent: Jun. 23, 1992

[54] DIELECTRIC MEDIUM FOR CAPACITOR OF SEMICONDUCTOR DEVICE

[75] Inventor: Sangin Lee, Suwon, Rep. of Korea

[73] Assignee: Samsung Electronics Co., Ltd., Kwonseon, Rep. of Korea

[21] Appl. No.: 637,314

[22] Filed: Jan. 3, 1991

[30] Foreign Application Priority Data

Jul. 2, 1990 [KR] Rep. of Korea .............. 90-9966

[51] Int. Cl.$^5$ .............. H01L 27/02; H01L 29/04
[52] U.S. Cl. .............. 357/51; 357/60; 361/321
[58] Field of Search .............. 357/51, 60; 361/321

[56] References Cited

U.S. PATENT DOCUMENTS 4,403,236 9/1983 Mandai et al. .............. 357/61
4,631,633 12/1986 Shaulov et al. .............. 361/321

OTHER PUBLICATIONS

S. I. Lee et al., "A Photoacoustic Study of Phase Transition in Modified Strontium Barium Niobate Ceramics", *Ferroelectrics*, (1990), vol. 107, pp. 355-359.

W. K. Choo et al., "A HREM Study of La and Li-Modified Strontium Barium Niobate Ceramics", *Ferroelectrics*, (1990), vol. 107, pp. 299-304.

S. I. Lee et al., "Modified Ferroelectric High Density Strontium Barium Niobate Ceramics for Pyroelectric Applications", *Ferroelectrics*, (1988), vol. 87, pp. 209-212.

*Primary Examiner*—J. Carroll
*Attorney, Agent, or Firm*—Christie, Parker & Hale

[57] ABSTRACT

A dielectric medium for the capacitor of a semiconductor device is disclosed. The dielectric material is prepared by replacing Sr and Ba in (Sr, Ba)Nb$_2$O$_6$ with La, and the replacement is carried out by adding 2 mole % or more of La$_2$O$_3$ to (Sr,Ba)Nb$_2$O$_6$, thereby forming a composition $(Sr_xBa_{1-x})_{1-(3/2)y}La_yNb_2O_6$ ($0.25 \leq x \leq 0.5$, $0.04 \leq y$). According to the present invention, the dielectric medium has the characteristics that the crystal structure is not affected even over the Curie temperature, and that a high dielectric constant and a low dielectric loss coefficient are maintained.

4 Claims, 4 Drawing Sheets

DIELECTRIC MEDIUM FOR CAPACITOR OF SEMICONDUCTOR DEVICE

BACKGROUND OF THE INVENTION

The present invention relates to a dielectric medium for capacitor of semiconductor device, and particularly to a dielectric medium made from a $(Sr,Ba)Nb_2O_6$ solid solution and for use in the capacitor a layer of high density devices such as a dynamic RAM or a static RAM.

Conventionally, in an effort to improve the density of the high density devices such as DRAM or SRAM (Dynamic RAM or Static RAM), the capacitor area is expanded by forming the capacitor in a stacked or trenched structure. However, there is a limit in improving the density by expanding the capacitor area by the above mentioned method.

Further, in the conventional capacitor layer of DRAM or SRAM, dielectric materials in the form of an oxide layer ($SiO_2$) or a nitride layer ($Si_3N_4$) are used. However, the dielectric constants of such dielectric materials are respectively 3.8 and 7, and therefore, the use of such materials is encountered with a great difficulty in improving the density and reliability of the semiconductor devices, because the capacitor layer becomes thinner and thinner as the density of the semiconductor device is increased.

If such a problem is to be solved, there is required a ferro-electric material or a high dielectric material rather than the above described oxide layer or the nitride layer. In this connection, $Ta_2O_5$, $TiO_2$ and $Nb_2O_5$ are proposed as the high dielectric material, while $Pb(Zr,Ti)O_3$ series such as $(Pb,La)(Zr,Ti)O_3$ are proposed as the ferro-electric material.

These ferro-electric materials and high dielectric materials have high dielectric constants, and therefore, they are advantageous for improving the density. However, their dielectric loss coefficients are as high as over 1%, and therefore, there is the problem that the leakage current is increased. Further, there occurs a phase transformation such that the crystal structure is changed at the Curie temperature during the heat treating process, and thus, the thin dielectric layer is destroyed due to the temperature variation. Therefore, the ultimate result is that there is a problem in using the ferro-electric material or the high dielectric material for the dielectric layer of capacitor.

There is a further problem such that, of the ferro-electric materials, the $Pb(Zr,Ti)O_3$ series causes destruction of stoichiometry due to the volatile component PbO.

SUMMARY OF THE INVENTION

The present invention is intended to overcome the above described disadvantages of the conventional devices.

Therefore it is the object of the present invention to provide a dielectric medium for use in the capacitor layer of a semiconductor device, in which the crystal structure is not changed even over the Curie temperature, and in which a high dielectric constant and a low dielectric loss coefficient are maintained.

In achieving the above object, the present invention is constituted such that a replacement is carried out by adding over 2 mole % of $La_2O_3$ to $(Sr,Ba)Nb_2O_6$, thereby obtaining a composition of $(Sr_xBa_{1-x})_{1-(3/2)y}La_yNb_2O_6$ ($0.25 \leq x \leq 0.5$, $0.04 \leq y$).

BRIEF DESCRIPTION OF THE DRAWINGS

The above object and other advantages of the present invention will become more apparent by describing in detail the preferred embodiment of the present invention with reference to the attached drawings in which.

DESCRIPTION OF THE PREFERRED EMBODIMENT

The ferroelectric material $(Sr_xBa_{1-x})Nb_2O_6$ ($0.25 \leq x \leq 0.5$) in the form of a solid solution takes a tungsten-bronze structure, and if $x = 0.25$, it undergoes a primary phase transition at the temperature of 273° C., while, if $x = 0.5$, it undergoes another phase transition at the temperature of 110° C. When it undergoes the primary phase transition, a transformation of the crystal structure or displacements of the atoms occur. In the case where the crystal structure is transformed, the lattices are changed, and therefore, if a thin dielectric layer of capacitor is formed using this material, the thin layer is destroyed or degraded.

Therefore, a replacement is carried out by adding two mole % or more of $La_2O_3$ to $(Sr_xBa_{1-x})Nb_2O_6$ ($0.25 \leq x \leq 0.5$) so as for $La_2O_3$ to be charge-balanced at the position of $(Sr_xBa_{1-x})$. Then the Sr and Ba atoms are replaced with the La atom, thereby making it possible to obtain a dielectric material having a composition of $(Sr_xBa_{1-x})_{1-(3/2)y}La_yNb_2O_6$ ($0.25 \leq x \leq 0.5$, $0.04 \leq y \leq 0.12$).

In a dielectric medium consisting of the above composition, a vacancy occurs only on a crystal plane 110 or 1$\overline{1}$0, and therefore, the transformation mode of the crystal structure is changed.

That is, due to the existence of a defect plane of the crystal plane 110 where the vacancy has occurred, the dielectric constant is increased at the normal temperature and the dielectric loss coefficient is abruptly decreased, with the result that the phase transformation is shifted to a diffuse phase transition, thereby making it possible to obtain a thin dielectric layer which is stable as against the temperature variation.

Here, the dielectric constant is over 200, and the dielectric loss coefficient is as small as 0.015%, thereby forming a superior ferro-electric material.

Figure 1:
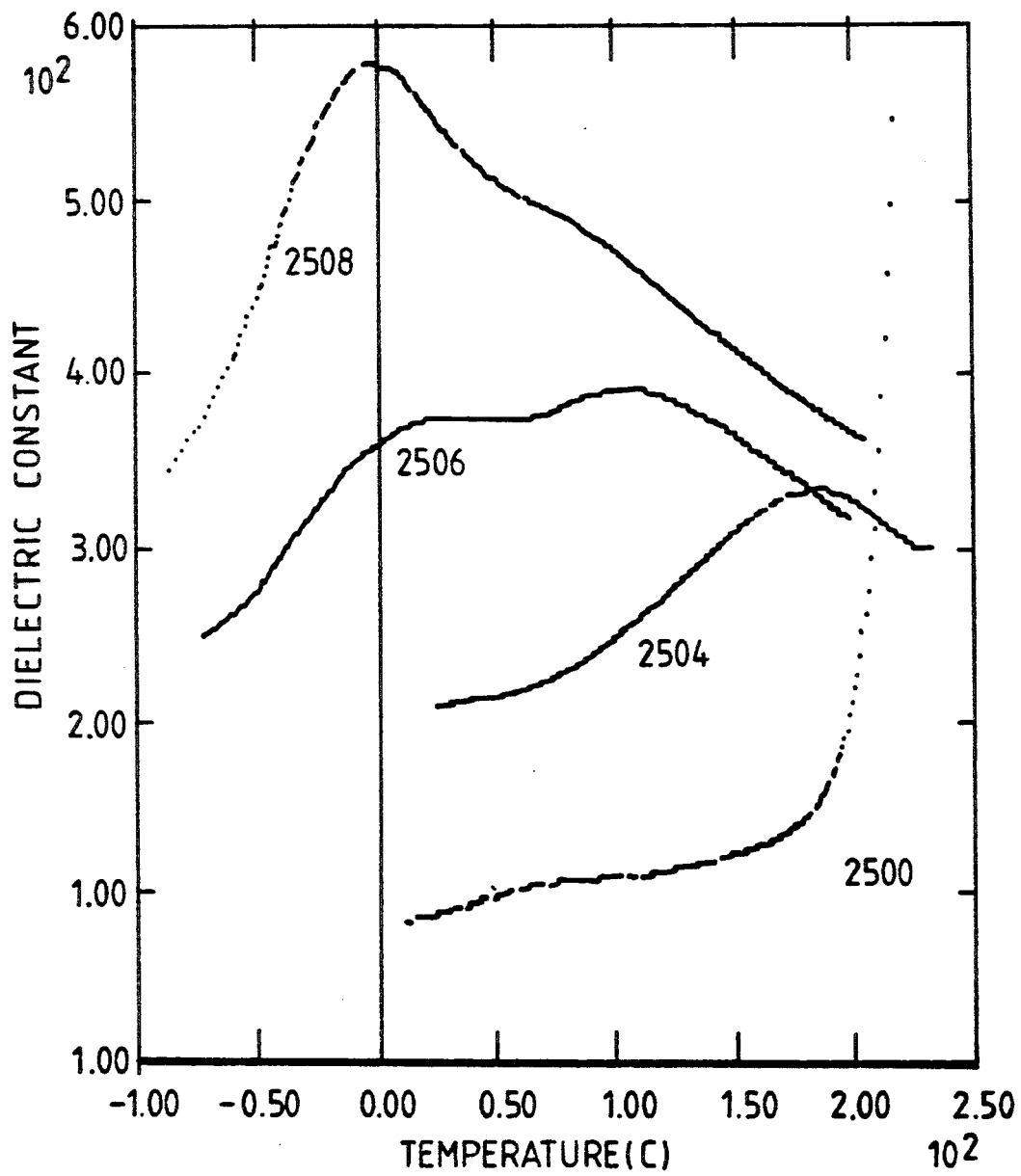
FIG. 1 illustrates the temperature characteristics of the dielectric constant as against the addition of $La_2O_3$ to $(Sr_{0.25}Ba_{0.75})_{1-(3/2)y}La_yNb_2O_6$.

FIG. 1 illustrates the temperature characteristics of the dielectric constant measured at 10 KHz as against the addition of $La_2O_3$ in $(Sr_{0.25}Ba_{0.75})_{1-(3/2)y}La_yNb_2O_6$. In this drawing, 2500, 2504, 2506 and 2508 are expressed as follows:

For example, if $x = 0.25$, and $y = 0.04$, then

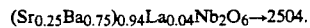

Therefore, in the case where $x = 0.25$, and where $y = 0.04$, 2504 is the expression of the distribution of the dielectric constant as against the temperature variation, while, in the case where x=0.25, and where y=0.06, 2506 expresses the distribution of the dielectric constant as against the temperature variation.

Meanwhile, in the case where y=0, i.e., in the case where $La_2O_3$ is not added at all to $(Sr_{0.25}Ba_{0.75})Nb_2O_6$, 2500 expresses the distribution of the dielectric constant as against the temperature variation.

As illustrated in the drawing, it can be seen that the dielectric constant can rise to above 200 depending on the variation of the temperature if $La_2O_3$ is added to $(Sr_xBa_{1-x})Nb_2O_6$.

Figure 2:
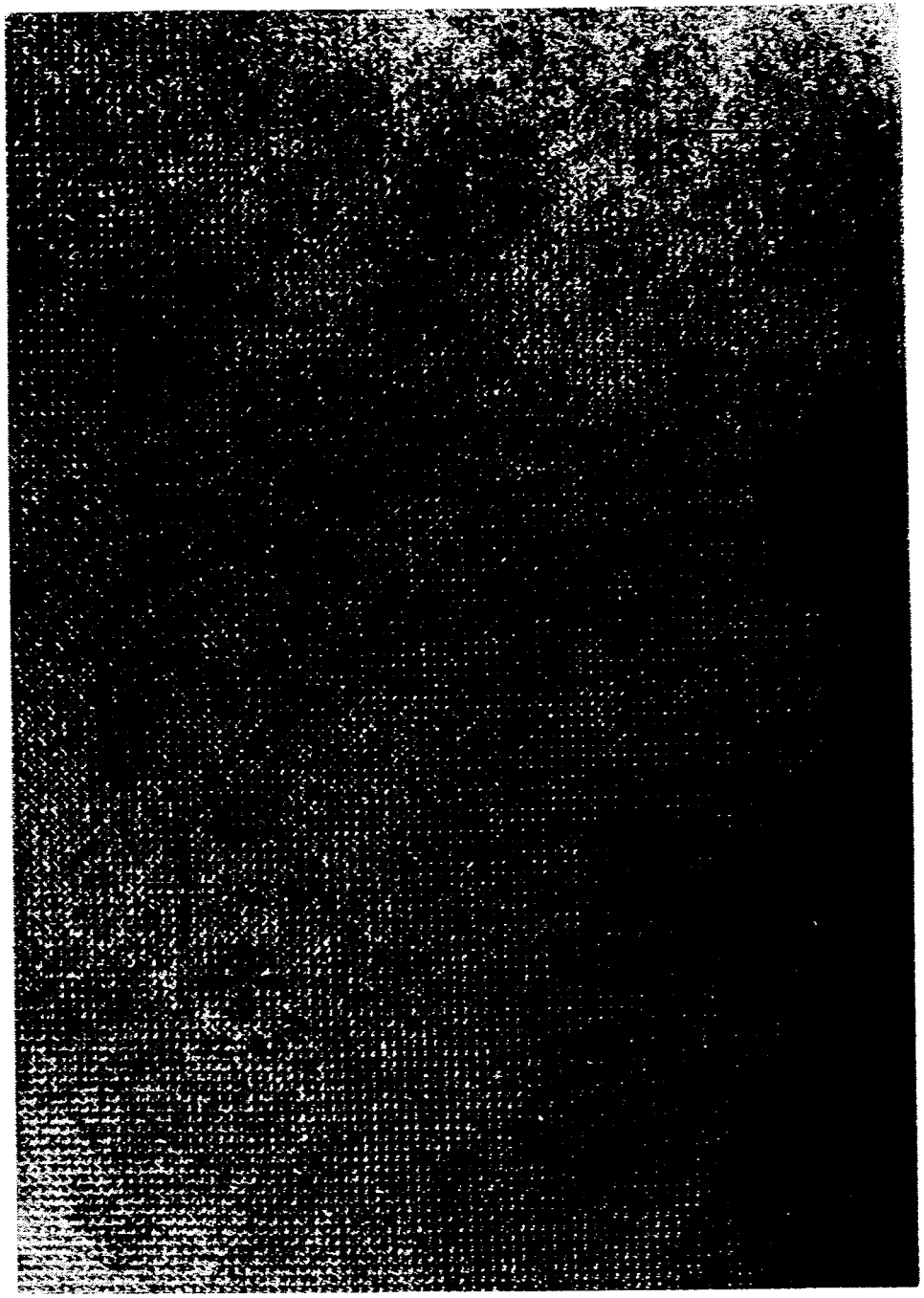
FIG. 2 is an electron micrograph of the crystal plane of $(Sr_{0.25}Ba_{0.75})Nb_2O_6$.
Figure 3:
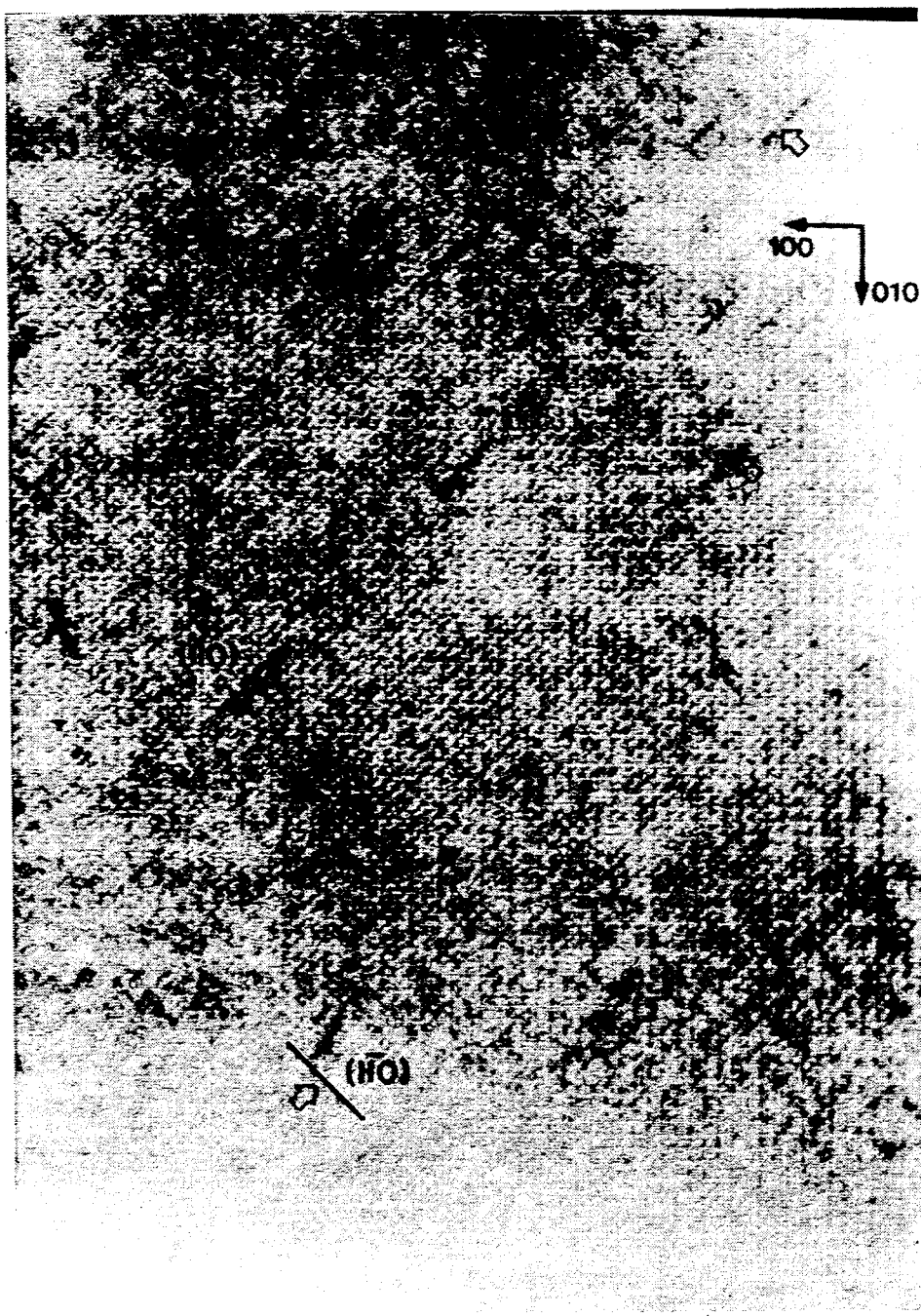
FIGS. 3 and 4 are electron micrographs of the crystal plane of $(Sr_{0.25}Ba_{0.75})_{0.94}La_{0.04}Nb_2O_6$.
Figure 4:
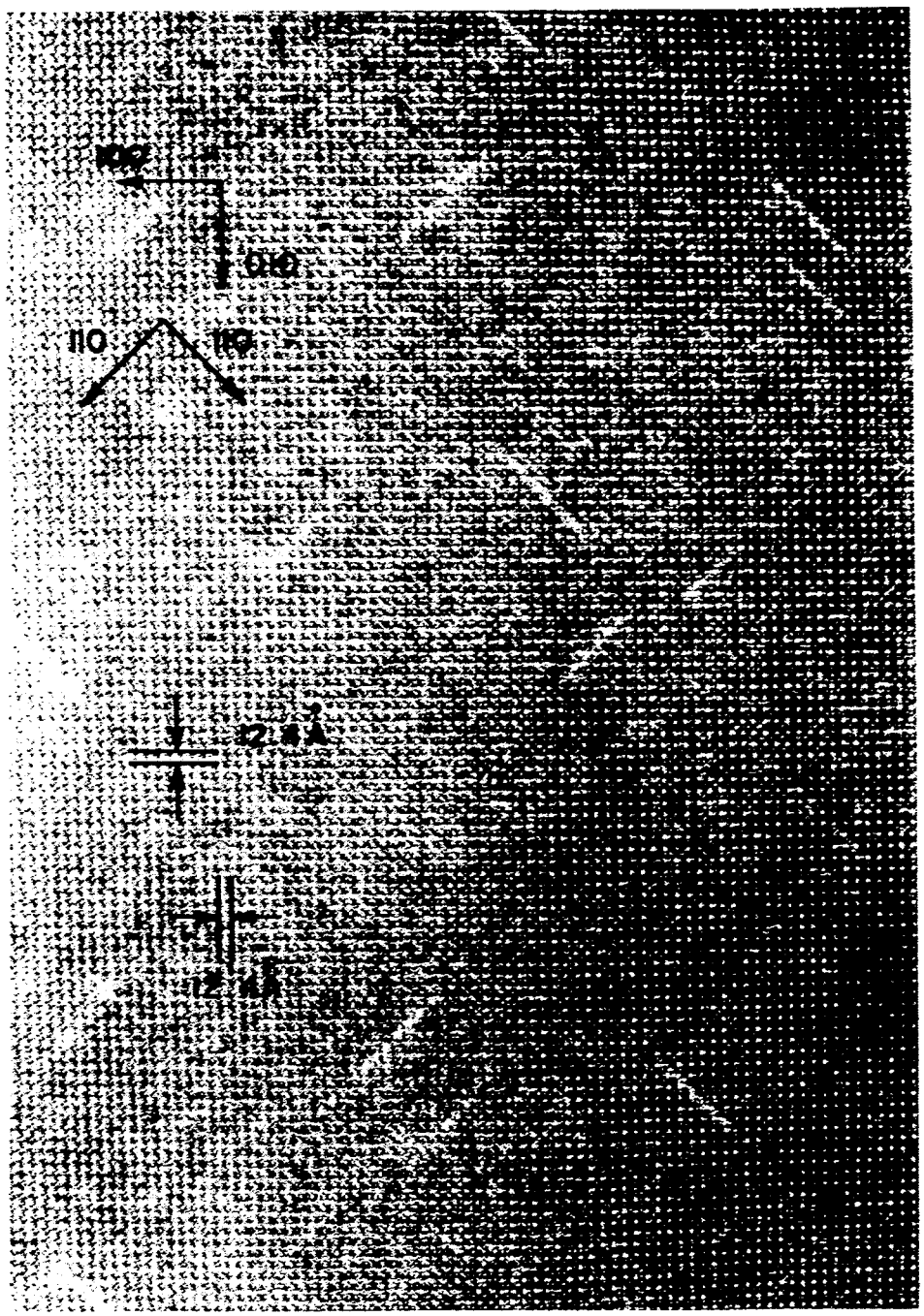

FIG. 2 is an electron micrograph of $(Sr_{0.25}Ba_{0.75})Nb_2O_6$ taken by a transmission electron microscope, and showing down to the unit cell size of 12.4 Å. FIGS. 3 and 4 are electron micrographs of $(Sr_{0.25}Ba_{0.75})_{0.94}La_{0.04}Nb_2O_6$ taken by a transmission electron microscope, FIG. 4 being an image reversal of FIG. 3.

Referring to FIGS. 2 and 4, if $La_2O_3$ is not added at all to $(Sr_xBa_{1-x})Nb_2O_6$, there appears no vacancy on the crystal plane. On the other hand, in the case of $(Sr_xBa_{1-x})_{1-(3/2)y}La_yNb_2O_6$ in which $La_2O_3$ is added to $(Sr_xBa_{1-x})Nb_2O_6$ according to the present invention, a vacancy occurs at the position of (Sr,Ba) owing to the variation of the charge balance. That is, defect planes occur on the crystal planes 110, 1$\bar{1}$0. The crystal plane 110 is angularly apart from the crystal plane 100 by 45 degrees, and is angularly apart from the crystal plane 1$\bar{1}$0 by 90 degrees.

The present invention described above makes it possible to obtain the following effects:

1. a stable capacitor layer for a semiconductor device can be formed owing to the increase of the dielectric constant, thereby making it possible to improve the density of the semiconductor device;
2. there is obtained a simple structured capacitor in which the density can be improved without undergoing the conventional trenching process or stacking process for forming the conventional trenched or stacked capacitor;
3. the crystal structure is not transformed as against the temperature variation during the manufacturing process, and therefore, the characteristics of the thin layer are not degraded; and
4. if the dielectric material of the present invention is used, the off-stochiometry due to a volatile component can be prevented.

What is claimed is:

1. A dielectric medium for the capacitor of semiconductor device, comprising a composition of $(Sr_xBa_{1-x})_{1-(3/2)y}La_yNb_2O_6 (0.25 \leq x \leq 0.5, 0.04 \leq y)$.

2. A semiconductor device using a dielectric medium on the capacitor thereof, said dielectric medium comprising: a composition of $(Sr_xBa_{1-x})_{1-(3/2)y}La_yNb_2O_6$ $(0.25 \leq x \leq 0.5, 0.04 \leq y)$.

3. A semiconductor device as recited in claim 2 wherein y is equal to or less than 0.12.

4. A dielectric medium as recited in claim 1 wherein y is equal to or less than 0.12.

* * * * *

UNITED STATES PATENT AND TRADEMARK OFFICE
CERTIFICATE OF CORRECTION

PATENT NO. : 5,124,777
DATED : June 23, 1992
INVENTOR(S) : Sangin Lee

It is certified that error appears in the above-identified patent and that said Letters Patent is hereby corrected as shown below:

Column 2, line 60, change the equation

"$(Sr_xBa_{1-x})_{1-(3/2)y}La_yNb_2O_3 \rightarrow 100x\ 0\ 100y$" to

--$(Sr_xBa_{1-x})_{1-(3/2)y}La_yNb_2O_6 \rightarrow 100x\ 0\ 100y$--.

Signed and Sealed this

Fourteenth Day of December, 1993

Attest:

BRUCE LEHMAN

*Attesting Officer*   *Commissioner of Patents and Trademarks*